United States Patent [19]

Taylor, Jr. et al.

[11] 4,118,858
[45] Oct. 10, 1978

[54] METHOD OF MAKING AN ELECTRONIC CALCULATOR

[75] Inventors: James B. Taylor, Jr.; Keith M. Cobb, both of Plano, Tex.

[73] Assignee: Texas Instruments Incorporated, Dallas, Tex.

[21] Appl. No.: 777,282

[22] Filed: Mar. 11, 1977

Related U.S. Application Data

[62] Division of Ser. No. 678,102, Apr. 19, 1976, abandoned.

[51] Int. Cl.² ............................................. H01H 13/26
[52] U.S. Cl. ......................................... 29/622; 29/626; 174/68.5; 200/5 A; 200/159 B; 364/712
[58] Field of Search ................. 29/622, 624, 628, 577, 29/593, 626, 625; 156/87, 228, 230, 232, 285, 286, 311, 382; 200/1 R, 5 R, 5 A, 11 R, 11 G, 11 H, 11 J, 11 K, 11 D, 159 B, 166 BH; 340/365 A; 179/90 K; 174/68.5; 235/152, 156

[56] References Cited

U.S. PATENT DOCUMENTS

| | | | |
|---|---|---|---|
| 3,722,086 | 3/1973 | Wikkerink et al. | 29/622 |
| 3,780,431 | 12/1973 | Feeney | 29/626 |
| 3,810,301 | 5/1974 | Cook | 29/593 |
| 3,833,838 | 9/1974 | Christiansen | 29/626 X |
| 3,860,771 | 1/1975 | Lynn et al. | 200/5 A |
| 3,898,421 | 8/1975 | Sizumura | 200/159 B |
| 3,908,075 | 9/1975 | Jackson et al. | 174/68.5 |
| 3,911,234 | 10/1975 | Kotaka | 174/68.5 X |
| 3,956,820 | 5/1976 | Swartz et al. | 29/577 |
| 3,971,127 | 7/1976 | Giguere et al. | 29/626 |
| 3,981,076 | 9/1976 | Nicolas | 29/626 |

*Primary Examiner*—Victor A. DiPalma
*Attorney, Agent, or Firm*—Rene' E. Grossman; Richard P. Berg

[57] ABSTRACT

Electronic calculators are manufactured by affixing conductors on an insulated substrate, by attaching a semiconductor logic and a tape-mounted display device to selected conductors and by interconnecting the conductors with a keyboard. The tape-mounted display device is provided with a plurality of leads carried by the tape different preselected distances from an axis of the display device. By using the method disclosed, the number of holes provided in the insulated substrate can be reduced or the use of such holes eliminated.

10 Claims, 7 Drawing Figures

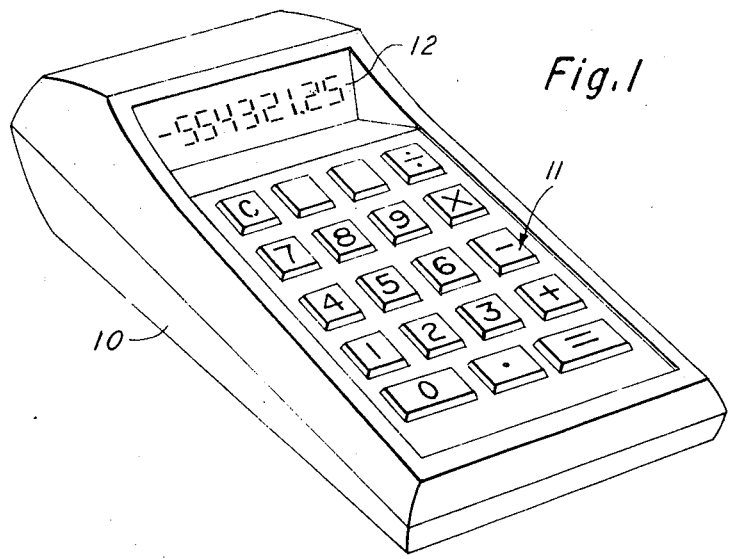
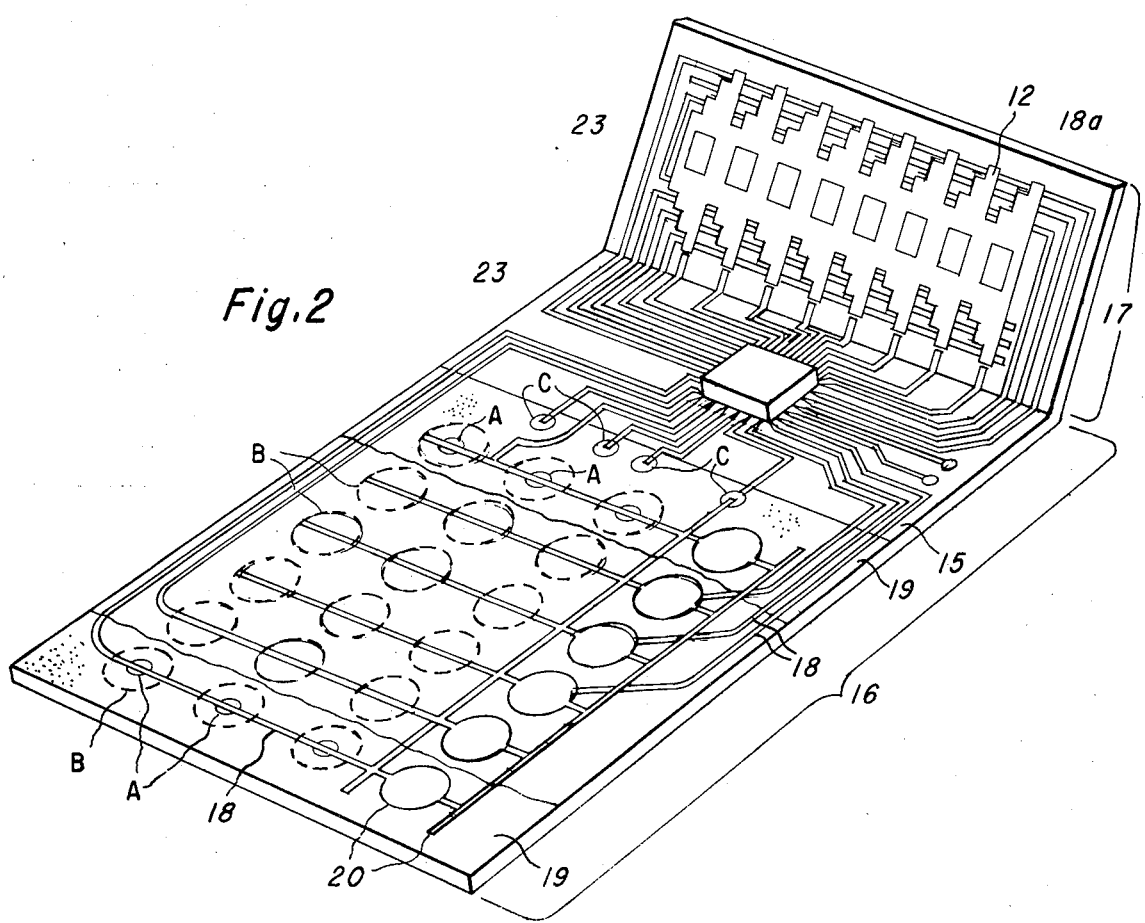

METHOD OF MAKING AN ELECTRONIC CALCULATOR

This is a division of application Ser. No. 678,102, now abandoned, filed Apr. 19, 1976.

This invention relates to improvements and methods of manufacturing an electronic calculator, specifically to a method of manufacturing an electronic calculator using an insulated substrate with a tape-mounted semiconductive logic device and a plurality of tape-mounted display devices attached thereto. Illustrative of the prior art methods of manufacturing electronic calculator are those methods which rely upon the use of printed wiring boards having conductors formed thereon, typically by substrative technology, with holes being formed through the substrate in-way-of selected conductors. The leads of conventionally packaged semiconductor devices, are inserted through the holes and a keyboard, similar to those in U.S. Pat. No. 3,806,673 or U.S. patent application Ser. No. 644,206, now U.S. Pat. No. 4,046,981, filed Dec. 24, 1975, is formed on the printed wiring board. Additionally, in the prior art, it was not uncommon that electronic calculators employed a plurality of discrete electrical devices in addition to one or more semiconductor devices.

The prior art method of manufacturing electronic calculator utilizing a substrate having a plurality of holes therein relies on the use of a die or drill-press arrangement for forming the holes in the substrate. Thus, when it is decided that an electronic calculator should be modified, for instance, by adding additional function capability, typically the die or drill-press arrangement must be altered in order to accommodate the change in circuit components used to implement the change in the calculator function capability. This requirement of having to change a die or drill-press arrangement is costly and tends to increase the costs of the electronic calculators made thereby. Moreover, it is desirable to have as few different types of boards as manufacturing circumstances will permit.

It is therefore one object of this invention to improve the method of manufacturing electronic calculators.

It is another object of this invention to reduce the number of holes formed in an electronic calculator substrate.

It is yet another object of this invention to either eliminate the holes formed in an electronic calculator substrate or to produce a substrate having a uniform hole pattern and able to accommodate a family of electronic calculators having a wide range of electronic function capabilities.

The foregoing objects are achieved as now described. Generally in accordance with the preferred embodiment of this invention, an adherent conductive circuit pattern is formed on an insulative substrate, the pattern being a predetermined arrangement of interconnective conductors, such as that utilized in an electronic calculator. A keyboard is formed upon the substrate utilizing selected portions of the conductors as key switch contacts. A tape-mounted semiconductor logic device is attached to the substrate in proper registration with selected conductors formed thereon. A tape-mounted display device is attached to the substrate similarly in proper registration with selected conductors formed thereon. The use of tape-mounted logic in display devices combined with an integral keyboard, such as the type disclosed in U.S. Patent application Ser. No. 678,104, filed Apr. 19, 1976, now abandoned, can entirely eliminate the need for holes to be formed through the calculator substrate. Alternatively, electronic calculators can be formed on two separate substrates, the tape-mounted logic and display devices being mounted on a first substrate and the keyboard being formed on a second substrate with a lead frame or other connector interconnecting the two substrates. The connector pattern may be standardized thereby eliminating the necessity for making changes in any pattern of holes formed in the first substrate to receive the lead frame from a keyboard having different numbers of keys to accommodate calculators having a range of function capabilities. The tape-mounted display device for either embodiment is mounted on its insulative tape along with its conductive leads. The conductive leads and tape are arranged to carry the leads a plurality of preselected distances from the axis of the display device to simplify the connection of the leads to generally parallel rows of conductors formed on the substrate near the display device.

DESCRIPTION OF THE DRAWINGS

FIG. 1 is a perspective view of an electronic calculator embodying the invention;

FIG. 2 depicts a preferred embodiment of our invention, an electronic calculator being formed on an insulative substrate with tape-mounted logic and display devices attached thereto and a keyboard formed thereon;

DETAILED DESCRIPTION

Figure 3:
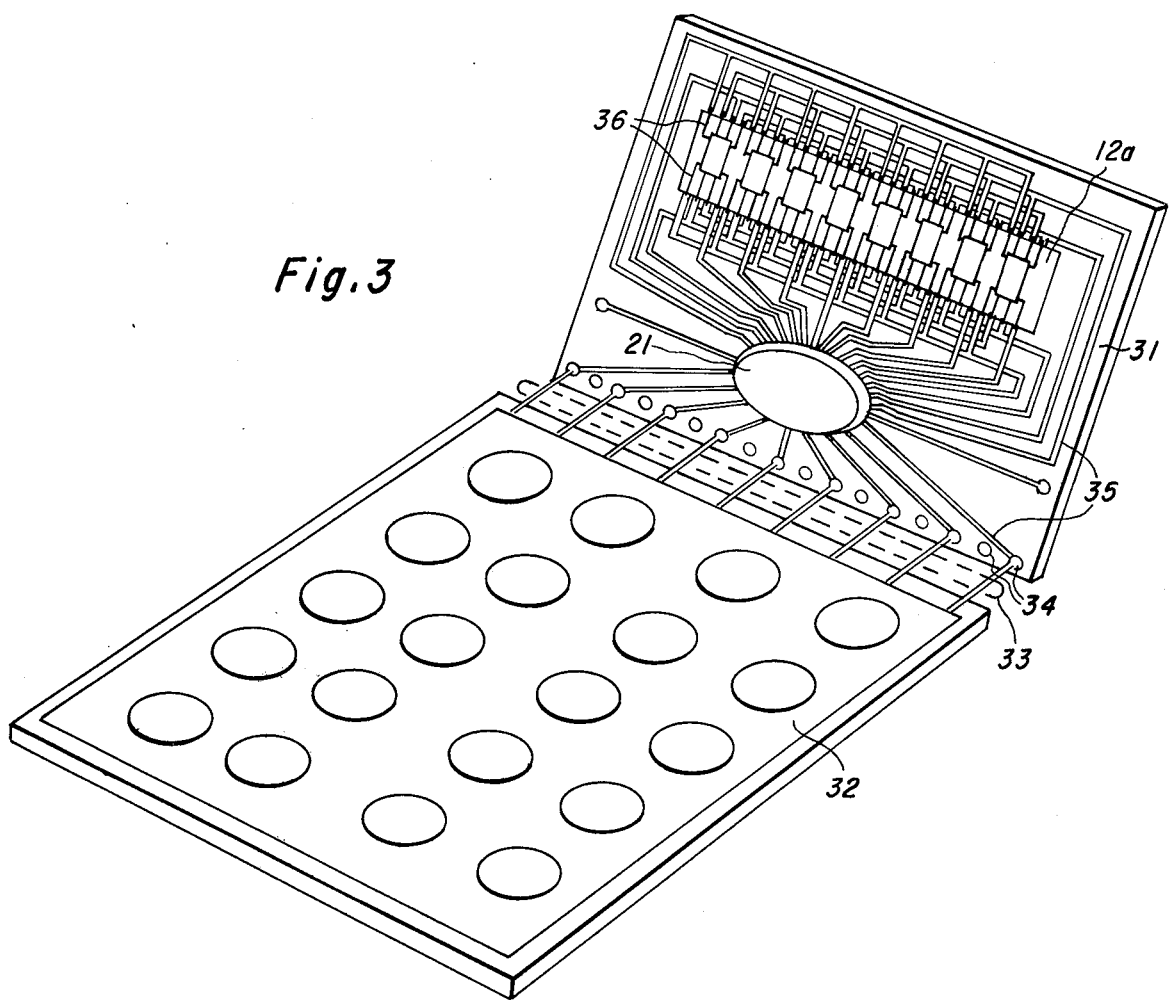
FIG. 3 depicts an alternate embodiment of our invention wherein an electronic calculator has two substrates interconnected by a lead frame, one substrate having a keyboard formed thereon, and a second substrate having tape-mounted logic and display devices attached thereto.

The calculator manufactured according to this invention is designed primarily for use in a hand-held, battery powered, pocket-size version as is generally shown in FIG. 1. The calculator substrate, upon which the electronics comprising the electronic calculator is disposed, is contained within a small housing 10, typically of molded plastic, and includes a keyboard 11 having ten decimal number keys, 0 to 9, along with a decimal point key and a plurality of function keys such as, for example, plus (+), minus (−), equals (=), multiply (×), divide (÷), clear (c), and the like. A display 12 is provided in the form of matrices of light-emitting diodes (LED), liquid crystal devices (LCD), or the like. While the calculator shown in FIG. 1 depicts a display having 8 digits plus a 9th "annotator" digit for minus sign, error or overflow, it is understood that the number of such digits is a design choice.

Referring now to FIG. 2, there is shown a preferred embodiment of our invention. A substrate 15 is shown as having a first portion 16 and a second portion 17 defining planes disposed at an angle to each other. A method of forming an insulative substrate disposed in two different planes is disclosed in U.S. Patent application Ser. No. 667,333, now U.S. Pat. No. 4,074,419, filed Mar. 16, 1976. Electrical conductors 18 are formed on the substrate, for example, in accordance with the method disclosed in U.S. Pat. No. 3,634,335 issued to Mark A. Nelson on Jan. 27, 1976 or U.S. Pat. No. 3,934,334 issued to Stephen L. Hanni on Jan. 27, 1976. Selected portions of the conductors 18 and insulated substrate 15 are covered with a solder mask 19 to protect and insulate the conductors 18 from the lead framed switch 20 which may be of the type dislcosed in U.S. Patent application Ser. No. 678,104, filed Apr. 19, 1976. Selected openings in solder mask 19 are shown by reference A; these openings expose portions of conductors 18 to serve as switch contacts under the lead framed switches 20.

Figure 4:
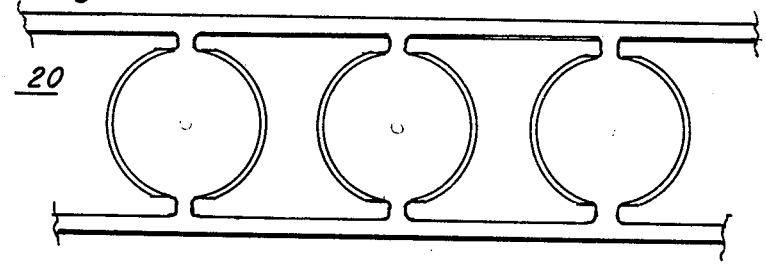
FIG. 4 depicts the key-switch contacts with lead frame.

Reference B depicts locations for additional discs from strips of lead framed switches 20. The lead framed switches 20 are electrically connected to conductors in openings in the solder mask 19 at Reference C. The lead framed switches are shown in FIG. 4. After connection to the circuit, the keyboard portion of the calculator substrate 15 is protected by applying an adhesive-backed film, such as that sold under the trademark Mylar by the Dupont Company over the lead framed switches 20 and substrate 15.

Attached to selected conductors 18 are leads 23 from a tape-mounted semiconductor logic device 21 and a tape-mounted display device 12. The lead framed switches 20 and the display devices 12 are disposed on different planes of the substrate 15 in order to dispose the display in a superior attitude for viewing by a calculator operator, as can be seen from FIG. 1.

Figure 5A:
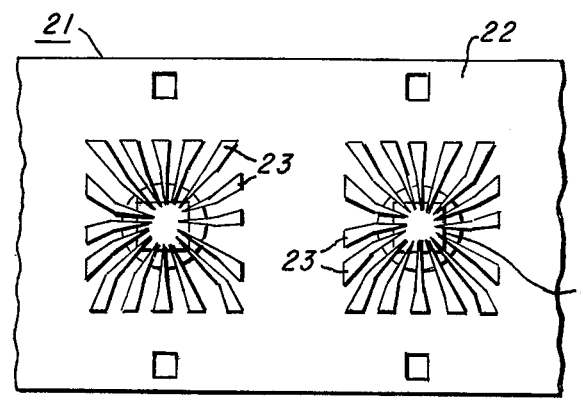
FIGS. 5a, 5b and 5c show typical tape-mounted logic and display devices.
Figure 5B:
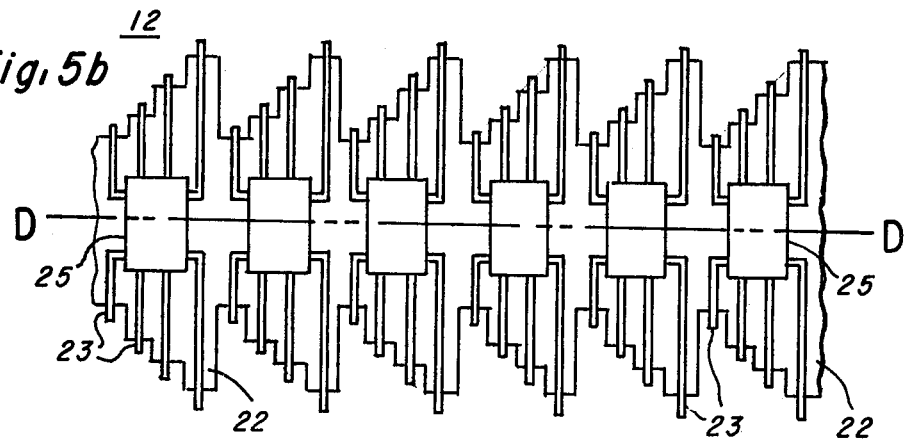
Figure 5C:
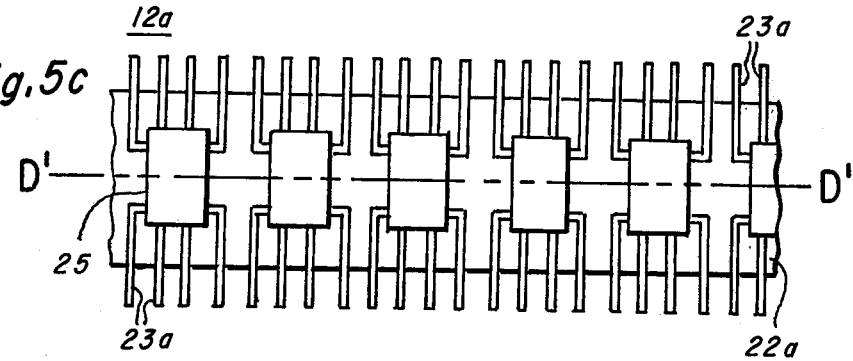

Referring now to FIGS. 5a, 5b and 5c, there are shown tape-mounted semiconducting logic devices 21 and tape-mounted display devices 12 and 12a. The tape mounted display devices 12 and 12a may comprise, for example, a plurality of light-emitting diode matrices 25 attached to leads 23 formed on the insulative tape 22. Each matrix 25 typically would serve as a digit of the display; it being understood, however, that other display devices, such as a liquid crystal display could be similarly utilized. Tape-mounted semiconducting devices are known in the art and are disclosed in U.S. Pat. Nos. 3,689,991 and 3,763,404.

Tape-mounted semiconductive logic device 21 depicted in FIG. 5a is generally of the type disclosed in the foregoing U.S. Patent and comprise a chip 24 attached to leads 23 which are supported by tape 22. The tape-mounted display device depicted in 5b, advantageously uses the insulative tape 22 to carry the leads 23 from each digit of the display preselected distances from an axis of the display device thereby permitting the display devices to be connected to generally parallel rows of conductors 18a (FIG. 2) affixed to calculator substrate 15. This advantageous use of the display tape 22 to carry leads 23 to the respective conductors 18a on substrate 15 eliminates the need for using multilayering techniques in the area of the display devices 12 in order to effect the interconnections between the leads 23 and the conductors 18a. The display device 12 as shown in FIG. 5b has its leads 23 being carried four different distances measured from the axis, reference D; it is understood that other numbers of differing distances are included within the scope of our invention.

Referring now to FIG. 5c, there is shown another embodiment of a tape-mounted display 12a wherein the display device leads 23a are supported more or less an equal distance by tape 22a from an axis, reference D; of the display device. It should be evident that the use of display 12a in lieu of display 12 may require use of multilayering techniques on the calculator substrate 15 in the area where the display 12a will be attached in order to easily effect the interconnections between the display leads 23a and the conductors 18a formed upon calculator substrate 15. One technique for multilayering is taught by U.S. Pat. No. 3,934,335.

It should further be evident that the tape-mounted semiconducting logic devices 21 depicted in FIG. 5a show the devices still mounted in a continuous tape, whereas the tape-mounted display devices shown in FIGS. 5b and 5c show the devices as removed from the continuous tape at the time the leads thereof (23 or 23a) are interconnected with the conductors 18a formed on the calculator substrate 15.

Using the tape-mounted display and logic devices and the keyboard depicted eliminates a need for forming holes through the substrate 15, thereby greatly simplifying the method of manufacturing an electronic calculator. The tape-mounted display and logic devices may be fixed to the conductor 18a formed on the substrate 15, for example, by ordinary soldering, by reflow soldering, or by using an electrically conductive cement such as that sold under the Trademark Ablebond 773-BRS by Ablestick Labs, Ablestick Adhestive Co. of Gardena, Calif. Soldering and reflow-soldering are well know in the art.

Referring now to FIG. 3, there is shown a second embodiment of our invention wherein the tape-mounted logic device 21 and the tape-mounted display devices 12a are mounted on a first substrate portion 31, the keyboard is formed on a second substrate portion 32, and the first and second substrate portions are interconnected by a lead frame connector 33. Of course, display devices 12 (FIG. 5b) could be used in lieu of display devices 12a to avoid using multilayered conductors. The keyboard may be the type disclosed, for example, in U.S. Pat. No. 4,005,293, which issued Jan. 25, 1977 and which is assigned to the assignee of this invention.

First substrate portion 31, which may comprise a flexible material such as polyester or polymide plastic or conventional printed circuit board material, or a combination thereof, is provided with means for connecting lead frame 33, such as a plurality of holes or recesses 34 for receiving lead frame connector 33 from the keyboard portion 32 or a plurality of pads for soldering the lead frame 33 thereto. With the use of a matrix-style keyboard, the number of leads in the lead frame 33 is generally equal to the number of columns and rows of keys comprising the keyboard portion 32. As is shown in FIG. 3, the keyboard portion has four columns and five rows of keys and thus its lead frame 33 has nine conductors. The first substrate portion, 31, which receives the lead frame 33 is shown as having seventeen holes 34, thereby being able to accommodate a keyboard having as many as 7 columns and 10 rows of switches. Of course, the number of holes 34 selected is a design choice, however, by selecting a sufficiently large number of holes 34, the first substrate portion may be standardized with respect to the number of holes 34 therein over a wide range of electronic calculators having different functional capabilities.

While the pattern of conductors 18 formed on first substrate portion 31 would typically have to be changed with a change in calculator function capability, this change is easily effected, for example, by changing the masks used during the manufacture of the substrate. But changes to the hole pattern can be eliminated by proper use of our invention, thereby eliminating expensive changes to the mechanical equipment used to form the holes 34 in substrate 31.

The tape-mounted logic display devices may be attached to substrate portion 31 by soldering, by reflow-soldering or by using an electrically conductive cement. The conductors 35, including the conductors 36 (which may be multilayered if desired) in the vicinity of the display 12a, are formed on substrate portion 31 using conventional techniques. Forming the calculator on two substrates permits the first portion 31, upon which the display devices 12 or 12a are mounted, to be advantageously disposed in a superior attitude for viewing, as is the calculator substrate 15 depicted in FIG. 2, without the necessity for bending the substrates in the embodiment shown in FIG. 3. However, it should be evident from the disclosure of U.S. Pat. No. 3,934,334 that the substrate shown in FIG. 2 is more amenable to mass production than the embodiment depicted in FIG. 3.

Having described the invention in connection with specific embodiments thereof, it should be understood that further modifications may suggest themselves to those skilled in the art. It is understood that the invention is not to be limited to the specific embodiments set forth in the appended claims.

What is claimed is:

1. A method of manufacturing electronic calculator comprising the steps of:
    (a) forming a pattern of conductors on an insulative substrate;
    (b) forming a keyboard on said substrate;
    (c) attaching the leads from a semiconductive logic device to selected conductors formed on said substrate; and
    (d) attaching the leads from at least one tape-mounted display device to selected conductors formed on said substrate, said tape-mounted display device having leads supported by the tape mounting said display device to at least two different distances from an axis of said display device.

2. The method according to claim 1, wherein said semiconductive logic device is tape-mounted.

3. The method according to claim 1, wherein said leads from said display device are attached to selected conductors formed on said substrate using electrically conductive cement.

4. The method according to claim 1, wherein said leads from said display device are attached to selected conductors formed on said substrate by solder.

5. The method according to claim 1, wherein said tape-mounted display device comprises a matrix of light emitting diodes, said matrix being connected to the conductive leads formed on said tape.

6. The method according to claim 1, wherein said keyboard is formed by forming key switch contacts on said substrate; attaching lead-framed switches to selected conductors formed on said substrate; and disposing the actuator portion of said switches over said key switch contacts.

7. The method according to claim 1, wherein said substrate has no holes formed therein.

8. A method of manufacturing electronic calculator comprising the steps of:
    (a) forming a pattern of conductors on an insulative substrate;
    (b) forming a plurality of pads along a margin of said substrate, at least two of said pads intersecting selected conductors formed on said substrate;
    (c) connecting at least two of said pads with conductors eminating from a keyboard;
    (d) attaching leads from a semiconductive logic device to selected conductors formed on said substrate; and
    (e) attaching the leads from at least one tape-mounted display device to selected conductors formed on said substrate, said tape-mounted display device including a pattern of conductive leads formed on the tape mounting said display devices, the leads being supported by said tape to at least two distances from an axis of said display device.

9. The method according to claim 8, wherein said tape-mounted display device comprises a matrix of light emitting diodes, said matrix being electrically connected with said pattern of conductive leads formed on said tape.

10. The method according to claim 8, further including the steps of forming holes through said pads formed on said substrate and inserting said conductors eminating from said keyboard through said holes.

* * * * *